(12) United States Patent
Fujita et al.

(10) Patent No.: US 7,777,736 B2
(45) Date of Patent: Aug. 17, 2010

(54) LIQUID CRYSTAL DEVICE, LIGHT-EMITTING DEVICE, AND ELECTRONIC APPARATUS

(75) Inventors: Shin Fujita, Suwa (JP); Yutaka Kobashi, Mizuha (JP); Shin Koide, Chino (JP); Tomoyuki Ito, Okaya (JP)

(73) Assignee: Epson Imaging Devices Corporation, Azumino-shi (JP)

( * ) Notice: Subject to any disclaimer, the term of this patent is extended or adjusted under 35 U.S.C. 154(b) by 944 days.

(21) Appl. No.: 11/525,938

(22) Filed: Sep. 25, 2006

(65) Prior Publication Data

US 2007/0070025 A1    Mar. 29, 2007

(30) Foreign Application Priority Data

Sep. 29, 2005  (JP)  .............................. 2005-284455

(51) Int. Cl.
G09G 5/00       (2006.01)

(52) U.S. Cl. .......................... 345/207; 345/77; 345/102

(58) Field of Classification Search .................. 345/55, 345/60, 63, 76, 77, 81, 82, 87, 89, 102, 204–207; 250/553

See application file for complete search history.

(56) References Cited

U.S. PATENT DOCUMENTS

| | | | | |
|---|---|---|---|---|
| 5,594,468 A | * | 1/1997 | Marshall et al. | 345/158 |
| 5,831,693 A | * | 11/1998 | McCartney et al. | 349/42 |
| 6,144,359 A | * | 11/2000 | Grave | 345/102 |
| 7,026,597 B2 | * | 4/2006 | Cok | 250/214 AL |
| 7,149,262 B1 | * | 12/2006 | Nayar et al. | 375/341 |
| 7,183,727 B2 | * | 2/2007 | Ferguson et al. | 315/308 |
| 7,271,378 B2 | * | 9/2007 | Cok | 250/214 AL |
| 7,468,722 B2 | * | 12/2008 | Ferguson | 345/102 |
| 7,492,390 B2 | * | 2/2009 | Kaplinsky | 348/217.1 |
| 2005/0151716 A1 | * | 7/2005 | Lin | 345/102 |
| 2007/0070002 A1 | * | 3/2007 | Fujita et al. | 345/87 |
| 2007/0268241 A1 | * | 11/2007 | Nitta et al. | 345/102 |

FOREIGN PATENT DOCUMENTS

| | | |
|---|---|---|
| JP | A 9-146073 | 6/1997 |
| JP | A 11-135291 | 5/1999 |
| JP | A-2002-023658 | 1/2002 |
| JP | A 2003-29239 | 1/2003 |
| JP | A-2003-37852 | 2/2003 |
| JP | A 2004-363421 | 12/2004 |
| JP | A2005-070065 | 3/2005 |
| JP | A 2005-121997 | 5/2005 |

OTHER PUBLICATIONS

U.S. Appl. No. 11/514,176, filed in the name of Shin Fujita et al., on Sep. 1, 2006.
Filed in the name of Shin Fujita et al., on Sep. 15, 2006.

* cited by examiner

*Primary Examiner*—Richard Hjerpe
*Assistant Examiner*—Tom V Sheng
(74) *Attorney, Agent, or Firm*—K&L Gates LLP

(57) ABSTRACT

A liquid crystal device includes a liquid crystal panel having a pair of substrates with a liquid crystal layer interposed therebetween, a plurality of light receivers that receives an ambient light and obtains an intensity information of the ambient light, and a controller that controls a display state of an image to be displayed on the liquid crystal panel. In the liquid crystal device, in at least one of the plurality of light receivers, sensitivity for the ambient light differs from the sensitivity of the other light receiver.

11 Claims, 6 Drawing Sheets

FIG. 4

| INTENSITY OF AMBIENT LIGHT | FIRST LIGHT-RECEIVING ELEMENT | SECOND LIGHT-RECEIVING ELEMENT | THIRD LIGHT-RECEIVING ELEMENT | SELECTION |
|---|---|---|---|---|
| WEAK ↑ ↓ STRONG | WITHIN DETECTION RANGE | NON-RESPONDING STATE | NON-RESPONDING STATE | FIRST LIGHT-RECEIVING ELEMENT |
| | WITHIN DETECTION RANGE | WITHIN DETECTION RANGE | NON-RESPONDING STATE | SECOND LIGHT-RECEIVING ELEMENT |
| | SATURATED STATE | WITHIN DETECTION RANGE | NON-RESPONDING STATE | SECOND LIGHT-RECEIVING ELEMENT |
| | SATURATED STATE | WITHIN DETECTION RANGE | WITHIN DETECTION RANGE | THIRD LIGHT-RECEIVING ELEMENT |
| | SATURATED STATE | SATURATED STATE | WITHIN DETECTION RANGE | THIRD LIGHT-RECEIVING ELEMENT |

LIQUID CRYSTAL DEVICE, LIGHT-EMITTING DEVICE, AND ELECTRONIC APPARATUS

This application claims the benefit of Japanese Patent Application No. 2005-284455, filed Sep. 29, 2005. The entire disclosure of the prior application is hereby incorporated by reference herein in its entirety.

BACKGROUND

1. Technical Field

The present invention relates to a liquid crystal device, an electro-optical panel light-emitting device and an electronic apparatus.

2. Related Art

A liquid crystal device utilized as a display unit of an electronic apparatus generally is equipped with a liquid crystal panel and a backlight that is an illuminator provided on a rear surface of the liquid crystal panel.

In such a liquid crystal device, LEDs (Light Emitting Diodes), for example, are used as the backlight, and a control circuit is provided for controlling the intensity of an illuminating light by regulating an amount of current supplied to the LEDs. In order to perform excellent display with a liquid crystal panel in the presence of an external light source of an electronic apparatus, there has been proposed a liquid crystal device (e.g., refer to JP-A-2005-121997) having a photo sensor constituted for example by a photo diode or photo transistor for measuring the intensity of an ambient light, and adjusting the intensity of backlight by means of a control circuit on the basis of an output of results obtained by the photo sensor.

As an existing method for measuring the intensity of ambient light by means of a photo sensor, there is a method of calculating light intensity by adopting a configuration in which a light-receiving surface of the photo sensor is irradiated with the ambient light for a predetermined period of time and then measuring a response time, which is the time taken from irradiation of the light-receiving surface with the ambient light to the output of an electronic signal produced by a photoelectric conversion. The above photo sensor has a characteristic that the response time thereof decreases as the intensity of the ambient light increases.

It is desirable that the photo sensor of such a liquid crystal device capable of adjusting the intensity of the illuminating light in accordance with the intensity of the ambient light has a higher resolution and an expanded detection range so as to enable the intensity of the illuminating light to be more finely adjusted. However, there is a problem that the resolution of the photo sensor of the above-mentioned existing liquid crystal device decreases as the intensity of the ambient light increases since the photo sensor has a characteristic that the response time thereof decreases as the intensity of the ambient light increases.

SUMMARY

An advantage of some aspects of the invention is that it provides a liquid crystal device, a light-emitting device, and an electronic apparatus having a higher resolution for the detection of the intensity of the ambient light and an expanded detection range.

Following configuration is adopted in the invention to solve the above-mentioned problem. According to one aspect of the invention, the liquid crystal device of the invention includes a liquid crystal panel having a pair of substrates with a liquid crystal layer interposed therebetween; a plurality of light receivers that receives an ambient light and obtains an intensity information of the ambient light; and a controller that controls a display state of an image to be displayed on the liquid crystal panel, in which, in at least one of the plurality of light receivers, sensitivity for the ambient light differs from the sensitivity of the other receivers.

According to this invention, a plurality of light receivers of which the light intensity detection range is different by differing the sensitivity is provided, and thus even if in a case where the intensity of the ambient light in one of among the plurality of light receivers is unable to be detected precisely, the intensity of the ambient light is obtained highly precisely on the basis of a response time of other light receivers. In this manner, higher resolution for the intensity of the ambient light can be obtained. Also, the detection range for the intensity of the ambient light according to the liquid crystal device can be expanded. For all above, the display state of the image on the liquid crystal panel is optimized in accordance with the intensity information.

For the liquid crystal device according to the invention, an area of the light-receiving surface of the light receiver may be larger than an area of the light-receiving surface of the other light receiver which is lower in the sensitivity than the light receiver.

According to this invention, when same configuration is adopted to a plurality of light receivers, sensitivity is increased as the area of the light-receiving surface is enlarged. Therefore, sensitivity in each light receiver can be set by adjusting the area of the light-receiving surface of each light receiver.

For the liquid crystal device according to the invention, the light-receiving surfaces of the plurality of light receivers are preferable to be provided in positions adjacent to each other.

According to this invention, the ambient light is irradiated at substantially same condition to each light receiver by each light-receiving surface being provided adjacently. Therefore, the unevenness of the intensity of the ambient light which to be received by each light receiver becomes small in range, and thus the intensity of the ambient light can be accurately obtained.

The liquid crystal device according to the invention is preferable to be further provided with an illuminator that irradiates an illuminating light to a rear surface of the liquid crystal panel, and that the controller controls the intensity of the illuminating light on the basis of an intensity information.

According to this invention, since the controller controls the intensity of the illuminating light from the illuminator on the basis of the intensity of the ambient light, appropriate display can be performed in the liquid crystal device without considering the external brightness of the liquid crystal device, and power consumption of the illuminator can be lowered at the same time.

For the liquid crystal device according to the invention, it is preferable that the controller includes a switch that selects the intensity information obtained by the plurality of light receivers on the basis of each sensitivity of the plurality of light receivers.

According to this invention, the controller controls the intensity of the illuminating light from the illuminator on the basis of the intensity information obtained by most appropriate light receivers that is selected by the switch on the basis of sensitivity of the light receivers. In this manner, it is displayed at a more appropriate intensity of the illuminating light.

For the liquid crystal device according to the invention, it is preferable for the switch to select the intensity information obtained by the light receiver of which is lowest in the sensitivity to the light receivers within the detection ranges.

According to this invention, the switch selects the intensity information obtained by the light receivers of which is lowest in the sensitivity among the plurality of light receivers existing in detection ranges for the intensity of the ambient light, and controls the intensity of the illuminating light on the basis of that intensity information. Herein, since the resolution of the intensity of the ambient light becomes smaller as the intensity of light to be received increases, the intensity of the ambient light is more accurately measured by selecting the intensity information obtained by the light receiver of which is lowest in the sensitivity.

In addition, the light-emitting device according to the invention includes an electro-optical panel having a pair of substrates with an electro-optical material layer interposed therebetween; a plurality of light receivers that receives an ambient light and obtains an intensity information of the ambient light; and a controller that controls a display state of an image to be displayed on the electro-optical panel, in which, in at least one of the plurality of light receivers, sensitivity for the ambient light differs from the sensitivity of the other light receivers.

According to this invention, as same to the above, the resolution for the intensity of the ambient light can be increased further by being provided with the plurality of light receivers of different sensitivity. Also, the detection range for the intensity of the ambient light can be expanded.

Furthermore, a display state of an image in electro-optical panel is optimized in response to the intensity information by the controller, and voltage apply to the electro-optical material layer is for example avoided, and thus life extension of the electro-optical material layer can be contrived.

The electronic apparatus according to the invention includes the above-mentioned liquid crystal device.

The electronic apparatus according to the invention includes the above-mentioned light-emitting device.

Since this invention includes the above-mentioned liquid crystal device and light-emitting device, the resolution for the intensity of the ambient light can be further increased and the detection range for the intensity of ambient light due to the liquid crystal device or the light-emitting device can be expanded.

BRIEF DESCRIPTION OF THE DRAWINGS

The invention will be described with reference to the accompanying drawings, wherein like numbers reference like elements.

FIG. 4 is a table showing a relationship between the ambient light intensity with respect to the light-receiving element selected by a switching unit.

DESCRIPTION OF EXEMPLARY EMBODIMENTS

Figure 1A:
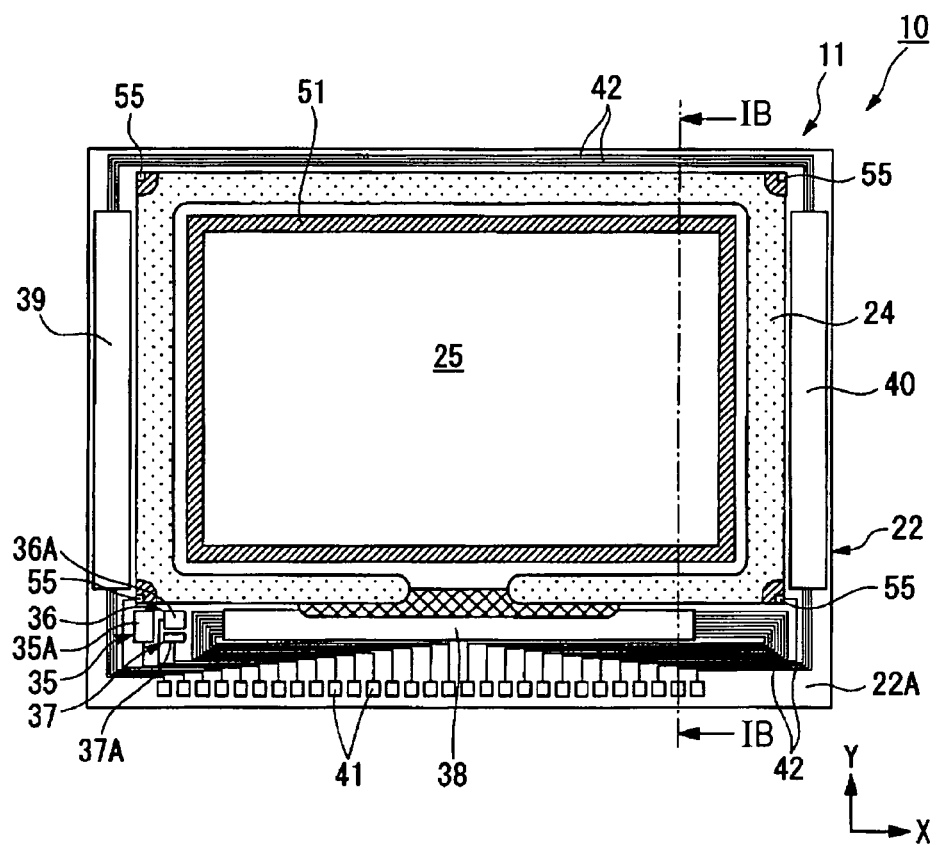
FIG. 1A is a plan view of a liquid crystal device according to a first embodiment of the invention.
Figure 1B:
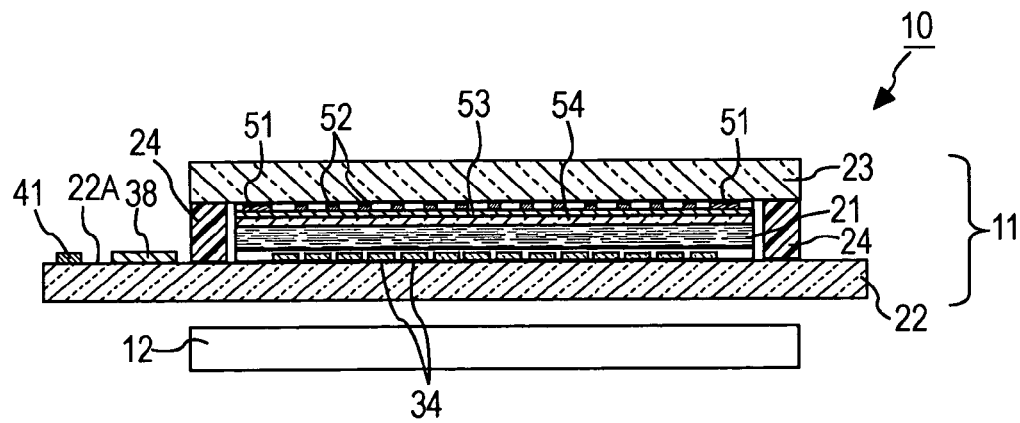
FIG. 1B is a cross-sectional view of the liquid crystal device according to the first embodiment of the invention.
Figure 2:
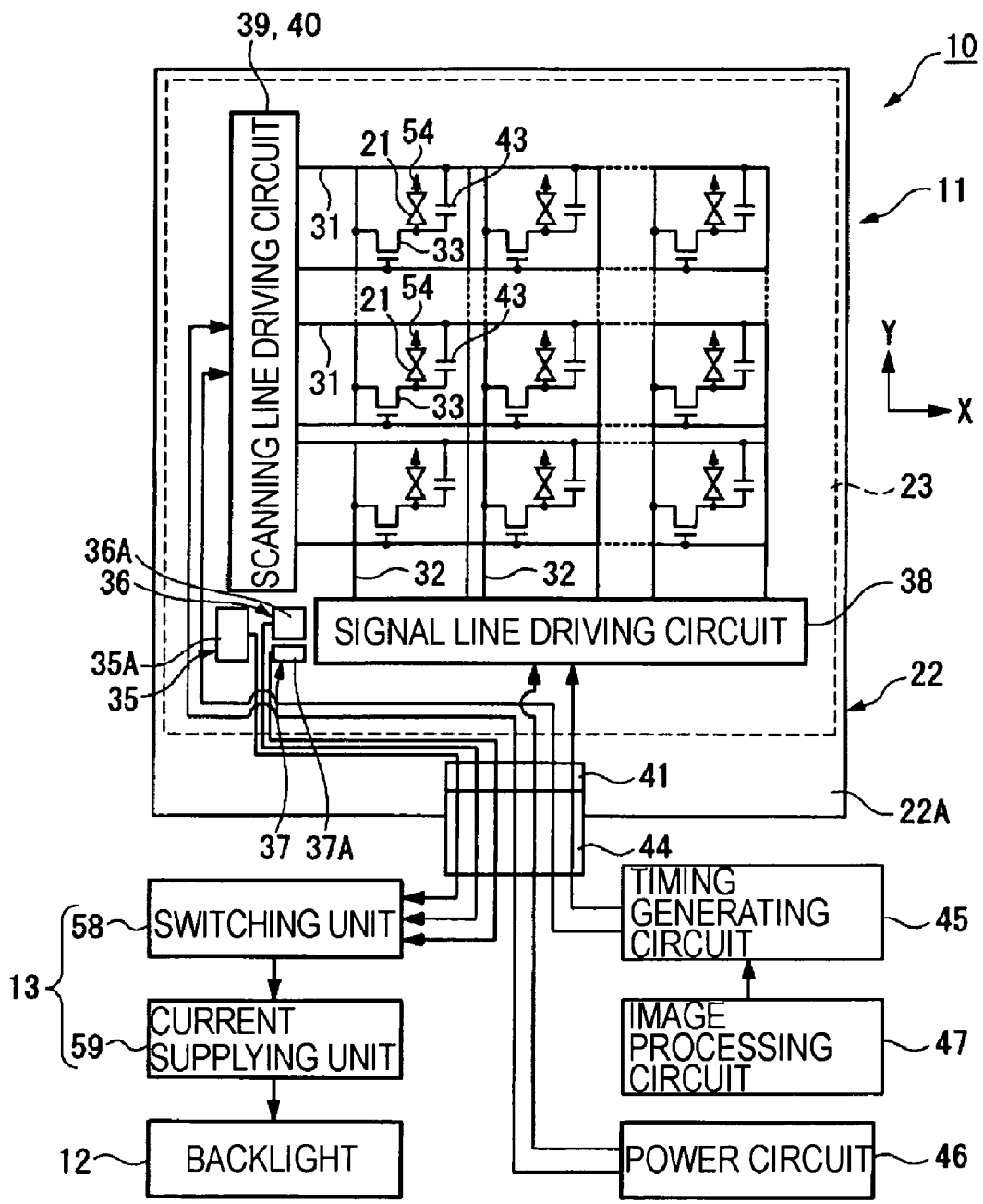
FIG. 2 is a circuit diagram of the liquid crystal device.

Hereinafter, a liquid crystal device and an electronic apparatus according to a first embodiment of the invention will be described with reference to the accompanying drawings. FIG. 1A is a plan view of the liquid crystal device, and FIG. 1B is a cross-sectional view taken along the line IB-IB of FIG. 1A. FIG. 2 is a circuit diagram showing a circuit configuration of the liquid crystal device.

A liquid crystal device 10 is a transmissive TFT (Thin Film Transistor) active-matrix-type liquid crystal device. As shown in FIGS. 1 and 2, the liquid crystal device 10 includes a liquid crystal panel 11, a backlight (an illuminator) 12 disposed on a rear surface of the liquid crystal panel 11, and a backlight control circuit (a controller) 13 that regulates the current supplied to the backlight 12 to control the intensity of the illuminating light.

As shown in FIG. 1A, the liquid crystal panel 11 includes a TFT array substrate (a first substrate) 22 and an opposite substrate (a second substrate) 23 which support a liquid crystal layer 21 in a sandwich manner, and a sealing member 24 which is disposed around edges of opposing surfaces of the first and second substrates, and has a substantially rectangular shape when seen from a plan view to seal the liquid crystal layer 21. The liquid crystal panel 11 includes an image display area 25 disposed inside a sealed area surrounded by a peripheral shielding layer 51 to be described below which is formed inside the sealing member 24 where the TFT array substrate 22 and the opposite substrate 23 overlap each other. In the liquid crystal panel 11, the TFT array substrate 22 is a rear substrate, whereas the opposite substrate 23 is a front substrate.

In addition, a polarizing plate (not shown) is disposed on each of the front surface and the rear surface of the liquid crystal panel 11. The pair of polarizing plates transmit only linearly polarized light oscillating in a particular direction, and are disposed such that there is substantially a 45° difference in a rubbing direction of an alignment films while transmission axes thereof are substantially perpendicular to each other.

For example, the liquid crystal layer 21 is formed of liquid crystal in which one or more types of nematic liquid crystal are mixed, and is disposed in a specific alignment state between alignment films (not shown) formed on the TFT array substrate 22 and the opposite substrate 23. The liquid crystal layer 21 may have a TN (Twisted Nematic) mode that uses liquid crystal having a positive dielectric anisotropy or a VAN (Vertical Aligned Nematic) mode that uses liquid crystal having a negative dielectric anisotropy.

The TFT array substrate 22 has a rectangular shape when seen from a plan view, and is formed of a transmissive material such as quartz, glass, plastic, or the like. The TFT array substrate 22 is formed with a protrusion 22A which protrudes outwards with respect to the opposite substrate 23 from one edge thereof (lower edge shown in FIG. 1A).

A plurality of scanning lines 31, signal lines 32, TFTs 33, and pixel electrodes 34 are disposed in an area where the TFT array substrate 22 overlaps the image display area 25. First to third light-receiving elements (light receiver) 35 to 37 are disposed on a side of the image display area 25 of the TFT array substrate 22. A signal line driving circuit 38 is provided along the above-mentioned one edge of the TFT array substrate 22. Scanning line driving circuits 39 and 40 are disposed along two sides adjacent to the above-mentioned one side of the TFT array substrate 22. Terminals 41 which are the terminal groups of the first to third light-receiving elements 35 to 37, the signal line driving circuit 38, and the scanning line driving circuits 39 and 40, are respectively disposed on the protrusion 22A of the TFT array substrate 22. These first to third light-receiving elements 35 to 37, the signal line driving circuit 38, the scanning line driving circuits 39 and 40, and the terminals 41 are electrically connected by wires 42.

As shown in FIG. 2, the scanning lines 31 extend in a direction X, and are formed of a metal such as aluminum. Further, as shown in FIG. 2, the signal lines 32 extend in a direction Y, such that they intersect each of the scanning lines 31. Similarly to the scanning lines 31, the signal lines 32 are formed of a metal such as aluminum. Pixel areas are formed by the scanning lines 31 and the signal lines 32.

Each pixel area is surrounded by two adjacent scanning lines 31 and two adjacent signal lines 32. When seen from a plan view, the pixel area is formed to overlap an area where a color filter (not shown) is disposed in the opposite substrate 23.

Each of the TFTs 33 is for example composed of an n-type transistor, and is disposed at an intersection point between one of the scanning lines 31 and one of the signal lines 32. In order to form TFTs, an amorphous polysilicon layer or a polysilicon layer obtained when an amorphous polysilicon layer is crystallized is partially formed on an upper surface of the TFT array substrate 22, and thereafter, impurities are partially introduced or activated.

The scanning lines 31 are correspondingly electrically connected to gates of the TFTs 33, and the pixel electrodes 34 are correspondingly electrically connected to drains of the TFTs 33.

In order to prevent leakage of the image signals stored in the pixel electrodes 34, retention capacitors 43 are connected in parallel to the pixel electrodes 34.

The pixel electrodes 34 are formed of a transmissive conductive material such as ITO (Indium Tin Oxide), and are each arranged so as to face an opposite electrode 54 (to be described later) disposed on the opposite substrate 23. The liquid crystal layer 21 is sandwiched between the pixel electrodes 34 and the opposite electrode 54 which is formed on the opposite substrate 23 so as to face the pixel electrodes 34.

The first to third light-receiving elements 35 to 37 are similar in configuration and are, for example, composed of a photodiode or a phototransistor. The first to third light-receiving elements 35 to 37 are disposed such that their respective light-receiving surfaces 35A to 37A are adjacent to each other.

When comparing the areas of the first to third light-receiving surfaces 35A to 37A, the first light-receiving surface 35A has the largest area, the area of the second light-receiving surface 36A is the next largest, and the area of the third light-receiving surface 37A is the smallest. Therefore, the sensitivity of the first light-receiving element 35 to the ambient light is the highest, and that of the second light-receiving element 36 is next highest, and that of the third light-receiving element 37 is the lowest.

These first to third light-receiving elements 35 to 37 receive ambient light at the first to third light-receiving surfaces 35A to 37A when a detection initiation signal is transmitted from the backlight control circuit 13, and output an electronic signal resulting from photoelectric conversion as intensity information to the backlight control circuit 13.

Figure 3:
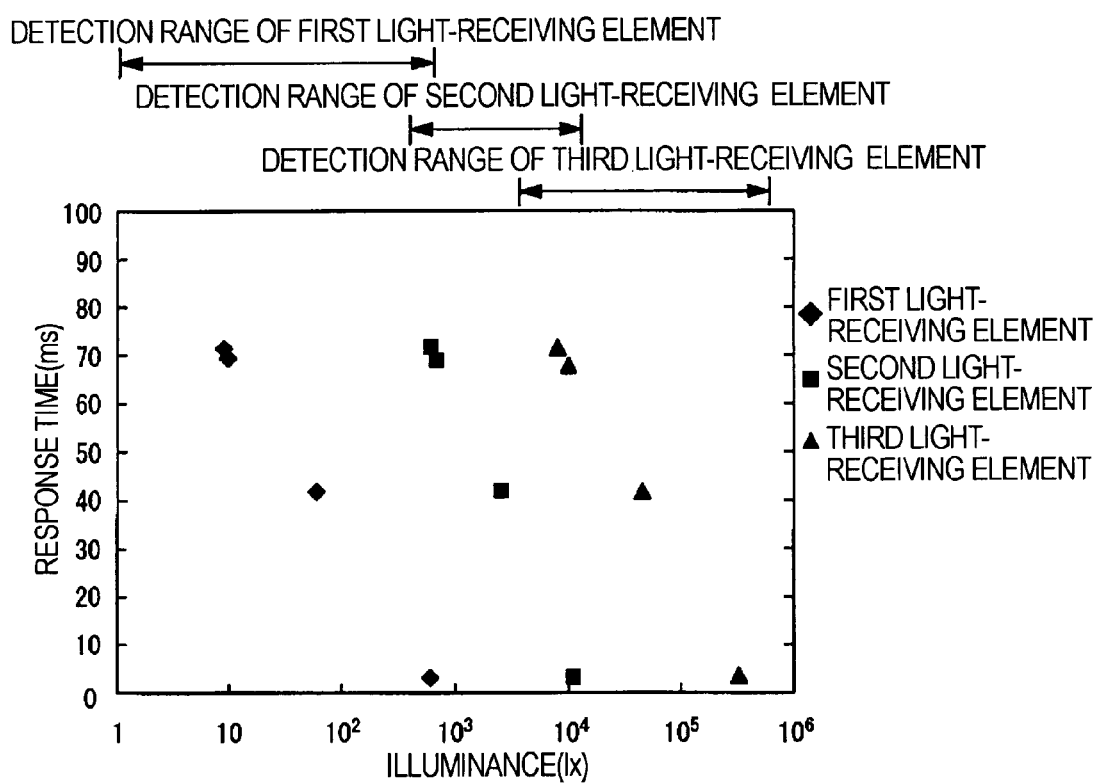
FIG. 3 is a graph showing a relationship between the ambient light intensity of each light-receiving element and the response time.

FIG. 3 is a graph showing the relationship between the light intensity of each light-receiving element of first to third light-receiving elements 35 to 37, and the response time. As shown in FIG. 3, the first to third light-receiving elements 35 to 37 have a characteristic that the response time, which is the time taken from reception of light and output of the electronic signal, decreases as the intensity of the ambient light individually respectively received by the light-receiving elements increases. Therefore, the intensity of the ambient light can be obtained from the sensitivity of the light-receiving elements and the response time thereof.

The detection range of the light intensity for each of the first to third light-receiving elements 35 to 37 is prescribed as the range existing when the response time, for example, is within the range of 1 to 80 ms. This is because, the light intensity cannot be accurately calculated when the response time is less than 1 ms as the light intensity is too high, and the light intensity is too low when the response time is more than 80 ms. Herein, a value of the response time less than 1 ms is referred as a saturated state and a value of the response time more than 80 ms is referred as a non-responding state.

According to the present embodiment, the sensitivities of the first light-receiving element 35 and second light-receiving element 36 are set such that the detection ranges thereof partially overlap, and also those of the second light-receiving element 36 and third light-receiving element 37 are set such that the detection ranges thereof partially overlap.

Here, for example, if the first to third light-receiving elements 35 to 37 are composed of a PIN (Positive-Intrinsic-Negative)-type photodiode, the PIN-type photodiode can be formed in a manner in which a p-type semiconductor region (P layer) is formed on one side of the intrinsic semiconductor region (I layer), and an n-type semiconductor region (N layer) is formed on the other side thereof, provided that a semiconductor layer constituting the first to third light-receiving elements 35 to 37 is an intrinsic semiconductor region (I layer) in which an intrinsic semiconductor or a negligible concentration of an impurity is introduced. Such a PIN-type photodiode can be formed by the same manufacturing process as is used for the TFT 33 by using a semiconductor layer formed by the same process as used for that of the TFT 33.

As shown in FIG. 2, the signal line driving circuit 38 is constructed to supply an image signal to the plurality of signal lines 32. Here, the image signal supplied to the signal lines 32 by the signal line driving circuit 38 may be supplied in the line order, or may be supplied to individual groups with respect to the plurality of adjacent signal lines 32.

The scanning line driving circuits 39 and 40 are constructed such that a scanning signal is supplied to the plurality of scanning lines 31 at a predetermined timing in the form of pulse in the line order.

The signal line driving circuit 38 and the scanning line driving circuits 39 and 40 are composed of an electrical circuit in which a transistor, a diode, a capacitor, and so on are combined, and are formed by partially introducing or activating impurities in an amorphous polysilicon layer or a polysilicon layer obtained when an amorphous polysilicon layer is crystallized partially formed on the upper surface of the TFT array substrate 22, like the TFTs 33 or the light-receiving element 35. Therefore, they can be formed by the same manufacturing process as that used for the TFT 33 or the light-receiving element 35.

The terminal 41 is connected with one end of a flexible substrate 44 by using an anisotropic conductive material such as an ACF (Anisotropic Conductive Film) or an ACP (Anisotropic Conductive Paste). A timing generating circuit 45 is electrically connected with the scanning line driving circuits 39 and 40, a power circuit 46 is electrically connected with the signal line driving circuit 38 and the scanning line driving circuits 39 and 40, and the first to third light-receiving elements 35 to 37 are electrically connected with the backlight control circuit 13 via the flexible substrate 44. The timing generating circuit 45 is connected to an image processing circuit 47.

As shown in FIGS. 1A and 1B, the opposite substrate 23 has a rectangular shape like the TFT array substrate 22 when seen from a plan view, and is formed of a transmissive material such as glass or plastic. The lower surface of the liquid crystal layer 21 of the opposite substrate 23 is laminated with the peripheral shielding layer 51, a display area shielding layer 52, a color filter layer 53, an opposite electrode 54, and an alignment film (not shown), in this order.

The peripheral shielding layer 51 has the shape of a rectangular frame when seen from a plan view, and is disposed along the inner circumferential surface of the sealing member 24 to define the image display area.

The display area shielding layer 52 has a grid or stripe shape when seen from a plan view, and is disposed to cover the image display area 25, an area inside the peripheral shielding layer 51.

The color filter layer 53 is composed of a plurality of color filters which are arranged in a matrix form when seen from a plan view, so as to correspond to the pixel areas described above.

The opposite electrode 54 is a flat layer formed of a transmissive conductive material such as ITO, as in the pixel electrode 34.

Four corner portions of the opposite substrate 23 are provided with upper and lower conductive materials 55 which function as upper and lower conductive terminals disposed between the opposite substrate 23 and the TFT array substrate 22. The upper and lower conductive materials 55 serve to electrically connect the opposite substrate 23 and the TFT array substrate 22.

The sealing member 24 has the shape of a rectangular frame when seen from a plan view, and is in contact with the TFT array substrate 22 and the opposite substrate 23. The sealing member 24 is composed of a material such as a UV curable resin, a thermosetting resin, and has undergone a curing process by being irradiated with an ultraviolet light or being heated after being coated at a specific position of the TFT array substrate 22. Further, the sealing member 24 is mixed with a gap material, such as glass fiber or glass beads, in order to provide a space (a gap between substrates) between the TFT array substrate 22 and the opposite substrate 23 of a predetermined size.

The backlight 12 is composed of a light source which is formed of white LEDs or the like, a light guide plate which guides illuminating light irradiated from the light source, and a reflector.

As shown in FIG. 2, the backlight control circuit 13 includes a switching unit (switch) 58, which is electrically connected to the first to third light-receiving elements 35 to 37 through the flexible substrate 44, and a current supplying unit 59 which is electrically connected to the backlight 12.

The switching unit 58 transmits the detection initiation signal for the first to third light-receiving elements 35 to 37 to receive the ambient light at a predetermined timing, and obtains the ambient light intensity on the basis of the response time by selecting the intensity information of any one light-receiving element included in the detection range from among the first to third light-receiving elements 35 to 37. Herein, the switching unit 58 discriminates whether the light-receiving element is outside the detection range on the basis of a value of the response time less than 1 ms being a saturated state and a value of the response time more than 80 ms being a non-responding state.

In addition, the switching unit 58 selects the intensity information output from the light-receiving element having a lower sensitivity than the above-mentioned one, when two elements from the first to third light-receiving elements 35 to 37 are included in the detection range. That is, as shown in FIG. 4, the switching unit 58 selects the intensity information output from the first light-receiving element 35 when the first light-receiving element 35 is within the detection range and the second and third light-receiving elements are in the non-responding state. When the first and second light-receiving elements 35 and 36 are within the detection range and the third light-receiving element 37 is in the non-responding state, the intensity information output from the second light-receiving element 36 is selected. When the first light-receiving element 35 is in a saturated state, the second light-receiving element 36 is within the detection range, and the third light-receiving element 37 is in a non-responding state, the intensity information output from the second light-receiving element 36 is selected. When the first light-receiving element 35 is in a saturated state and the second and third light-receiving elements 36 and 37 are within the detection range, the intensity information output from the third light-receiving element 37 is selected. When the first and second light-receiving elements 35 and 36 are in a saturated state and the third light-receiving element 37 is within the detection range, the intensity information output from the third light-receiving element 37 is selected.

A current supplying unit 59 regulates current supplied to the backlight 12 on the basis of the intensity of the ambient light calculated by the switching unit 58, and thereby controls the illuminating light intensity.

Figure 5:
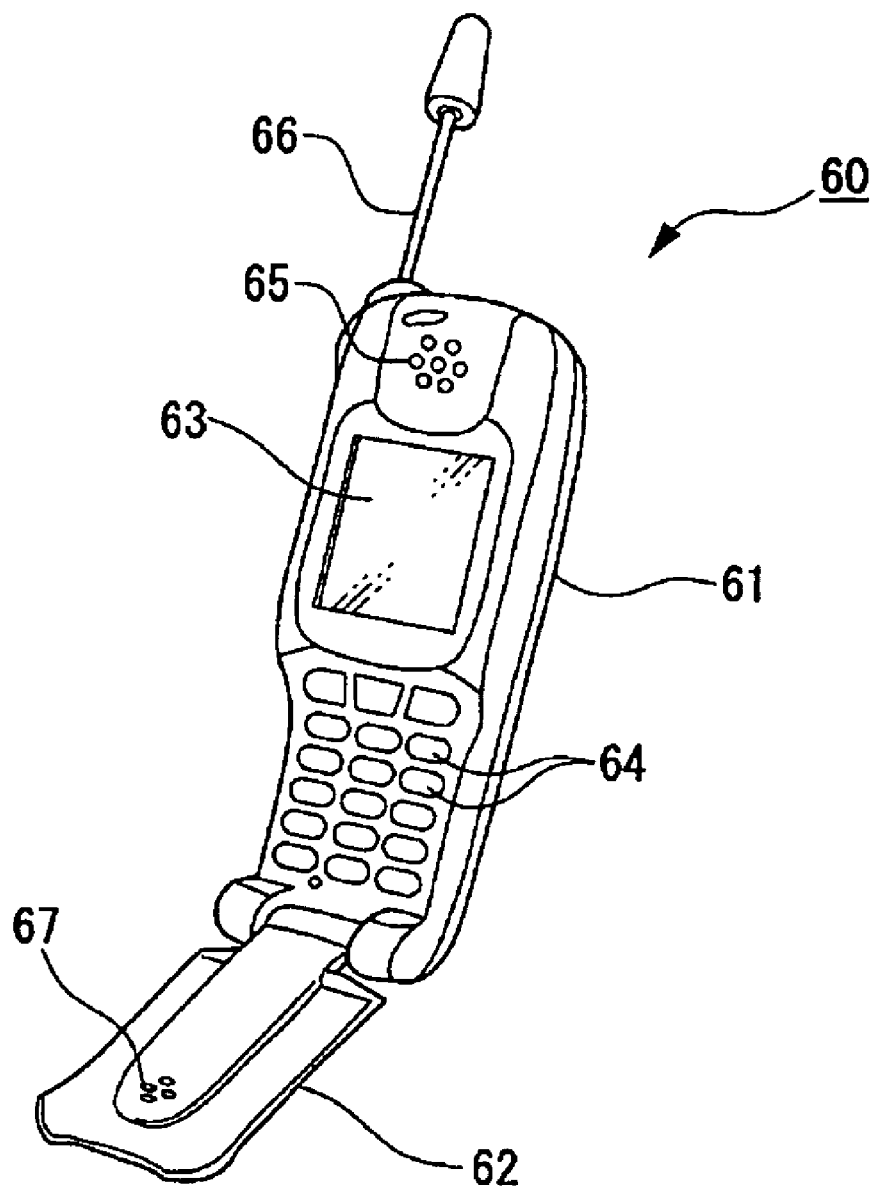
FIG. 5 is a perspective view of a mobile phone according to the first embodiment of the invention.

The liquid crystal device 10 having such configuration can be applied to a mobile phone (an electronic apparatus) 60 as shown in FIG. 5. FIG. 5 is a perspective view of a mobile phone.

The mobile phone 60 includes a body 61 and a cover 62 which is connected to the lower end of the body 61 via a hinge mechanism. The cover 62 can be opened and closed against the body 61. Further, the body 61 includes a display unit 63 composed of the above-mentioned liquid crystal device 10, an operation unit 64 including a plurality of operation keys, an earpiece 65, and an antenna 66. The cover 62 includes a mouthpiece 67.

Next, a method of controlling the intensity of the illuminating light of the backlight 12 on the basis of the ambient light intensity in the mobile phone 60 employing the liquid crystal device 10 having the above-mentioned structure will be described.

First, the switching unit 58 transmits the detection initiation signal to the first to third light-receiving elements 35 to 37. In this way, the first to third light receiving elements 35 to 37 receive and photoelectrically convert the received ambient light, and output the converted electrical signal to the switching unit 58 as the intensity information. Thereafter, the switching unit 58 selects intensity information of any one light-receiving element judged to be within the detection range from the response time of the first to third light-receiving elements 35 to 37, and obtains the intensity of the ambient light on the basis of the response time.

Herein, the switching unit 58 selects the intensity information output from the element having a lower sensitivity than the other one, when two elements from the first to third light-receiving elements 35 to 37 are included in the detection range. That is, when the first and second light-receiving elements 35 and 36 are within the detection range, and the third light-receiving element 37 is in a non-responding state, the switching unit 58 selects the intensity information of the ambient light output from the second light-receiving element 36. When the first light-receiving element 35 is in a saturated state and the second and third light-receiving elements 36 and 37 are within the detection range, the switching unit 58 selects the intensity information output from the third light-receiving element 37.

Since the first to third light-receiving elements 35 to 37 each having a different light detection range are provided, the intensity of the ambient light can be detected at a high resolution, and also the detection range can be expanded. Also, since the light-receiving element having the lower sensitivity is selected when two light-receiving elements are within the detection range, higher resolution can be achieved.

The current supplying unit 59 calculates the intensity of the illuminating light of the backlight 12 relative to the intensity of the ambient light obtained from the switching unit 58. The intensity of the illuminating light of the backlight 12 is adjusted by regulating the amount of current supplied to the backlight 12.

The switching unit 58 retransmits the detection initiation signal to the first to third light-receiving elements 35 to 37 after a lapse of the predetermined period of time, and the intensity of the illuminating light of the backlight 12 is adjusted as in the above-mentioned procedure.

According to the above, the intensity of the illuminating light of the backlight 12 is controlled.

According to the liquid crystal device 10 and the mobile phone 60 having the above-mentioned configuration, the first to third light-receiving elements 35 to 37 having different detection ranges and different sensitivities are provided so that the resolution for the detection of the intensity of the ambient light is increased. Also, the detection range for the intensity of the ambient light can be expanded.

In addition, since the first to third light-receiving surfaces 35A to 37A are adjacently disposed, on a side of area where the image display area 25 of the TFT array substrate 22 overlaps, the first to third light-receiving elements 35 to 37 are irradiated with the illuminating light at substantially same intensity. Therefore, the intensity of the ambient light can be more accurately detected. Also, the intensity of the ambient light near the display unit 63, which can be seen by the user of the mobile phone 60, can be measured.

The intensity of the ambient light can be more accurately measured since the switching unit 58 selects the intensity information output from the element having a lower sensitivity than the other one, when two elements from the first to third light-receiving elements 35 to 37 are included in the detection range.

Figure 6:
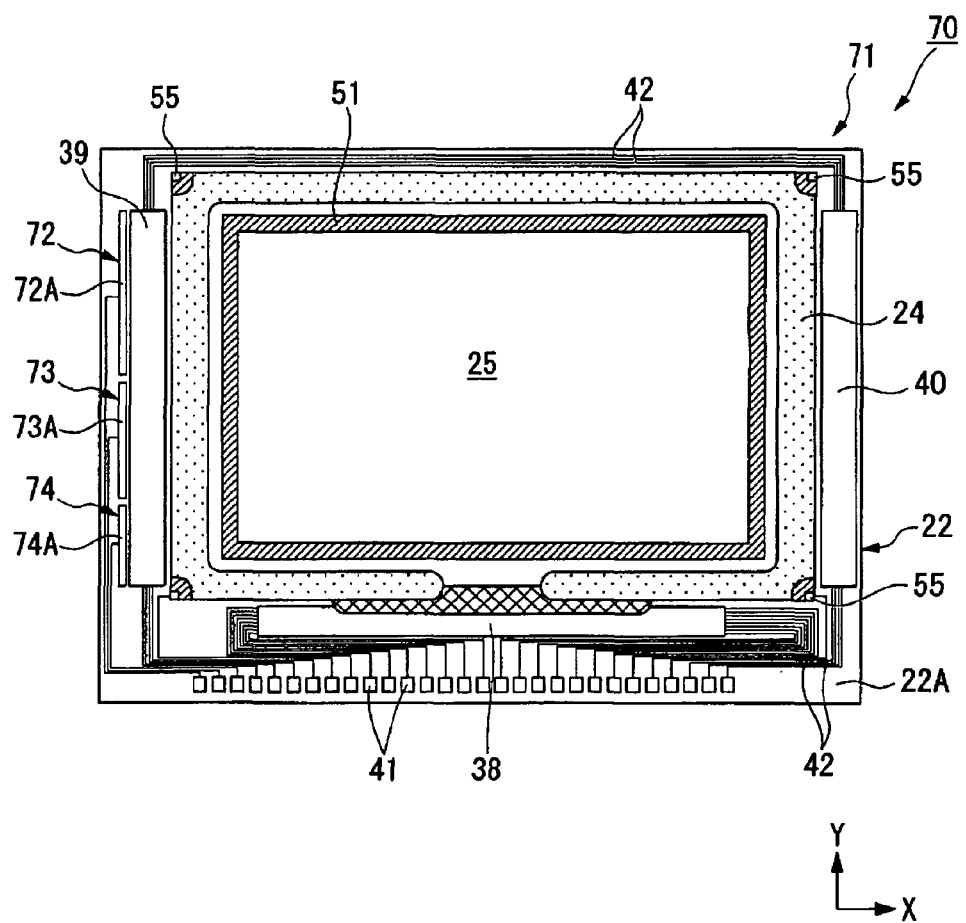
FIG. 6 is a plan view of the liquid crystal device according to a second embodiment of the invention.

Next, a second embodiment will be described with reference to the FIG. 6. The present embodiment has the same basic structure as that of the first embodiment of the invention described above, and additional elements are added to the first embodiment of the invention. Therefore, in FIG. 6, like reference numerals denote like elements of FIG. 1A, and descriptions thereof will be omitted.

Different aspects between the first and second embodiments lie in that the first to third light-receiving elements 35 to 37 are disposed on a side of an area where the image display area 25 of the TFT array substrate 22 overlaps in the liquid crystal device 10 in the first embodiment, whereas the first to third light-receiving surfaces 35A to 37A of the first to third light-receiving elements 35 to 37 are disposed along two sides adjacent to the above-mentioned side of the TFT array substrate 22, as same to the scanning line driving circuit 39, in the liquid crystal panel 71 of the liquid crystal device in the second embodiment.

In a liquid crystal device having such configuration, same operation and effects as the first embodiment are exhibited.

The invention is not limited to the above embodiments, and various changes in form may be made therein without departing from the scope and spirit of the invention.

For example, in the above-mentioned embodiment, the detection range of each light-receiving element partially overlaps to the other range, but the detection range of the intensity of the ambient light in each light-receiving element may be appropriately varied. Detection ranges for the plurality of total light-receiving elements can be expanded in such configuration of detection ranges not overlapping to each other in comparison with the configuration of detection ranges partially overlapping to each other. Herein, the switching unit selects the intensity information output from one light-receiving element in the detection range while the light-receiving element is in a saturated or non-responding state.

Other than controlling the intensity of the illuminating light on the basis of the intensity of the ambient light received by the light-receiving elements, it may also be in a configuration that corrects an image to be displayed on the liquid crystal panel on the basis of the intensity of the ambient light.

In addition, the configuration that the switching unit selects the intensity information output from the light-receiving elements lower in the sensitivity to the other two light-receiving elements, may also be in a configuration that selects the intensity information output from the light-receiving elements higher in the sensitivity.

Moreover, other than that the switching unit obtains the intensity of the ambient light on the basis of the response time of each light-receiving element, it may also be in a configuration that obtains the intensity of the ambient light on the basis of the voltage signal or the electrical signal output from each light-receiving element.

The plurality of light-receiving elements are not limited to be disposed on three places, and it may also be disposed on two or four or more places.

The sensitivity of each light-receiving element is set by adjusting an area of the light-receiving surface, but this sensitivity of each light-receiving element may also be set by adjusting materials such as semi-conductive materials constituted in the light-receiving elements and introduced impurities, or by adjusting a structure of the light-receiving elements.

In addition, each light-receiving element formed on the TFT array substrate may be formed on the opposite substrate if the ambient light may be received from the light-receiving surface. Also, it may be in a configuration that each light-receiving surface is disposed nearby the display unit on a case of the mobile phone.

Although the liquid crystal device is a transmissive type which displays the image on the liquid crystal panel by using the illuminating light irradiated from the backlight without considering the intensity of the ambient light, the liquid crystal device may also be a semi-transmissive type which performs the display by using the illuminating light of the backlight when the intensity of the ambient light is weak and by reflecting the ambient light entered from the front surface of the liquid crystal panel with use of the reflecting layer disposed within the liquid crystal panel when the intensity of the ambient light is strong.

In addition, the liquid crystal panel in an active matrix structure may also be in a passive matrix structure. In this case, a reed-shaped transparent electrode is arranged in a stripe form on one side of a substrate corresponding to the TFT array substrate when seen from a plan view, so as to have a structure in which a reed-shaped transparent electrode is arranged in a stripe form on the other side of a substrate corresponding to the opposite substrate, when seen from a plan view, in a cross manner with respect to the transparent electrode formed on the one side of the substrate.

The color filter formed on the upper surface of the side of the liquid crystal layer of the opposite substrate, may also be formed on the upper surface of the front surface of the opposite substrate, or on the TFT array substrate.

In addition, although the liquid crystal device is described in the above-mentioned embodiments, it may also be an electro-optical device such as an organic EL device which includes an electro-optical panel having a pair of substrates formed of a semi-translucency material with an electro-optical material layer, which is formed of an organic light-emitting material or the like that emits light by applying voltage, interposed therebetween.

By applying the invention to such electro-optical device, similarly to the above, higher resolution for the intensity of the ambient light can be obtained and the detection range for the intensity of the ambient light can be expanded at the same time. Also, life extension of the electro-optical material layer can be contrived, since voltage is not excessively applied to the electro-optical material layer by optimizing the voltage which to be applied to the electro-optical panel. As the electro-optical device, it is not limited to the organic EL device, and it may be any electro-optical device having other electro-optical panel.

In addition, although the electronic apparatus equipping the liquid crystal device is described in the above-mentioned embodiments, it may also be an electronic apparatus equipping such mentioned electro-optical device.

In addition, the peripheral shielding layer formed on the opposite substrate may also be partially or entirely placed on the TFT array substrate as an embedded shielding layer.

Although the timing generator, the power source circuit, and the backlight control circuit are connected to the signal line driving circuit or the scanning line driving circuit, the light-receiving elements and so on via the flexible substrate, some or all of them may also be formed on the TFT array substrate, similarly to the signal line driving circuit or the scanning line driving circuit.

On the surface of the TFT array substrate, in addition to the above signal line driving circuit, the scanning line driving circuit and so on, a sampling circuit that samples and supplies an image signal to a signal line; a precharge circuit that supplies a precharge signal of a specific voltage to a plurality of signal lines, respectively, prior to the image signal; and a test circuit that tests a mobile phone in terms of quality or defect thereof in a manufacturing or shipment process, can be also provided.

Although the signal line driving circuit or the scanning line driving circuit is formed on the upper surface of the TFT array surface, the invention may have a structure in that a COF (Chip On Film) substrate mounted with a driving LSI, which has the function of the signal line driving circuit or the scanning line driving circuit, electrically and mechanically connects to the scanning line and the signal line on the TFT array substrate via an anisotropic conductive material.

Phase difference plates may be disposed inside a pair of polarizing plates, respectively. In this case, as a phase difference plate, a circular polarizing plate may be configured along with the pair of polarizing plates by using a $\lambda/4$ plate having a phase difference of approximately ¼ wavelength with respect to a wavelength in a visible light range. Further, a broadband circuit polarizing plate may be configured by combining a $\lambda/2$ plate and a $\lambda/4$ plate.

An optical compensation film may be optionally placed on either one or both of inner sides of the pair of polarizing plates. A phase difference of the liquid crystal layer shown when the liquid crystal device is seen from a plan view and a perspective view can be compensated by means of the optical compensation film, and thus light leakage can be reduced to increase contrast. In this case, the optical compensation film may be a negative uniaxial medium which is formed by aligning a discotic liquid crystal molecule or the like having a negative refraction index anisotropy in a hybrid manner. Further, a positive uniaxial medium may also be used which is formed by aligning a nematic liquid crystal molecule or the like having a positive refraction index anisotropy in a hybrid manner. Furthermore, the negative uniaxial medium and the positive uniaxial medium may be combined for use. In addition, a double axial medium of which refraction indices in every direction thereof meet the relation of nx>ny>nz, or a negative C-plate may be used.

Although the mobile phone is used as an electronic apparatus in the above embodiments, the invention is not limited to the mobile phone. In other words, if a display unit using the liquid crystal device of the invention is placed, the electronic apparatus may be other types of electronic apparatus such as an electronic book or projector, a personal computer, a digital still camera, a television set, a view finder type or monitor direct-view type video tape recorder, a car navigation system, a pager, an electronic scheduler, a calculator, a word processor, a workstation, a video telephone, a POS terminal, a PDA (Personal Digital Assistant), a touch panel, and the like.

What is claimed is:

1. A liquid crystal device comprising:
   a liquid crystal panel having a pair of substrates with a liquid crystal layer arranged therebetween;
   a plurality of light receivers that receive ambient light and obtain an intensity information of the ambient light; and
   a controller that controls a display state of an image to be displayed on the liquid crystal panel, the controller includes a switch that selects the intensity information obtained by the light receiver which has a lowest sensitivity from among the plurality of light receivers within a detection range,
   wherein a detection range of at least one of the plurality of light receivers to the ambient light differs from a detection range of the other light receivers.

2. The liquid crystal device according to claim 1, wherein a first area of a light-receiving surface of the light receiver having a higher sensitivity is larger than a second area of a light-receiving surface of a light receiver having a lower sensitivity.

3. The liquid crystal device according to claim 1, wherein the light-receiving surfaces of the plurality of light receivers are arranged adjacent to each other.

4. The liquid crystal device according to claim 1, further comprising an illuminator that irradiates an illuminating light to a rear surface of the liquid crystal panel,
   wherein the controller controls an intensity of the illuminating light based on the intensity information.

5. An electronic apparatus comprising the liquid crystal device according to claim 1.

6. The liquid crystal device according to claim 1, wherein a response time of at least one of the plurality of light receivers to an amount of illuminance of the ambient light differs from a response time of the other light receivers.

7. The liquid crystal device according to claim 1, further comprising:

a switching unit to use a detection result of one of the plurality of light receivers that can detect most accurately.

8. A light-emitting device comprising:

an electro-optical panel having a pair of substrates with an electro-optical material layer arranged therebetween;

a plurality of light receivers that receive ambient light and obtain an intensity information of the ambient light; and a controller that controls a display state of an image on the electro-optical panel, the controller includes a switch that selects the intensity information obtained by the light receiver which has a lowest sensitivity from among the plurality of light receivers within a detection range, wherein a detection range of at least one of the plurality of light receivers to the ambient light differs from a detection range of the other receivers.

9. An electronic apparatus comprising the light-emitting device according to claim 8.

10. A display comprising:

a plurality of light receivers that receive ambient light and produce intensity information based on the received ambient light; and a controller electrically coupled to the light receivers that controls a display state of the display based on the intensity information, the controller includes a switch that selects the intensity information obtained by the light receiver which has a lowest sensitivity from among the plurality of light receivers within a detection range, wherein at least on of the plurality of light receivers has a detection range to the ambient light that differs from a detection range of the other light receivers.

11. The display according to claim 10, wherein the controller controls the display state of the display by varying an illumination of the display.

* * * * *